United States Patent [19]

Glennon

[11] Patent Number: 4,532,443
[45] Date of Patent: Jul. 30, 1985

[54] PARALLEL MOSFET POWER SWITCH CIRCUIT

[75] Inventor: Timothy F. Glennon, Rockford, Ill.

[73] Assignee: Sundstrand Corporation, Rockford, Ill.

[21] Appl. No.: 507,737

[22] Filed: Jun. 27, 1983

[51] Int. Cl.³ .................... H03K 17/687; H03K 3/01
[52] U.S. Cl. .................................. 307/575; 307/270; 307/200 A
[58] Field of Search ............ 307/270, 200 A, 200 B, 307/254, 575, 253, 571; 361/4, 9, 13, 72, 84, 100

[56] References Cited

U.S. PATENT DOCUMENTS

| | | | |
|---|---|---|---|
| 3,209,161 | 9/1965 | Lovci et al. | 307/200 A |
| 3,636,385 | 1/1972 | Koepp | 307/304 |
| 3,641,407 | 2/1972 | Scott | 361/84 |
| 3,879,640 | 1/1975 | Schade | 307/304 |
| 4,066,918 | 1/1978 | Heuner et al. | 307/304 |
| 4,363,068 | 12/1982 | Burns | 361/100 |
| 4,420,784 | 12/1983 | Chen et al. | 361/13 |

Primary Examiner—Stanley D. Miller
Assistant Examiner—B. P. Davis
Attorney, Agent, or Firm—Wood, Dalton, Phillips, Mason & Rowe

[57] ABSTRACT

A power switching circuit for controlling the power from a DC supply to a regenerative load. The switching circuit includes a plurality of parallel connected MOSFETs. A first diode is connected in parallel with the MOSFET switches and poled to conduct reverse current from the load. A second diode is connected in series with the MOSFETs to block the flow of reverse current through the MOSFETs.

3 Claims, 1 Drawing Figure

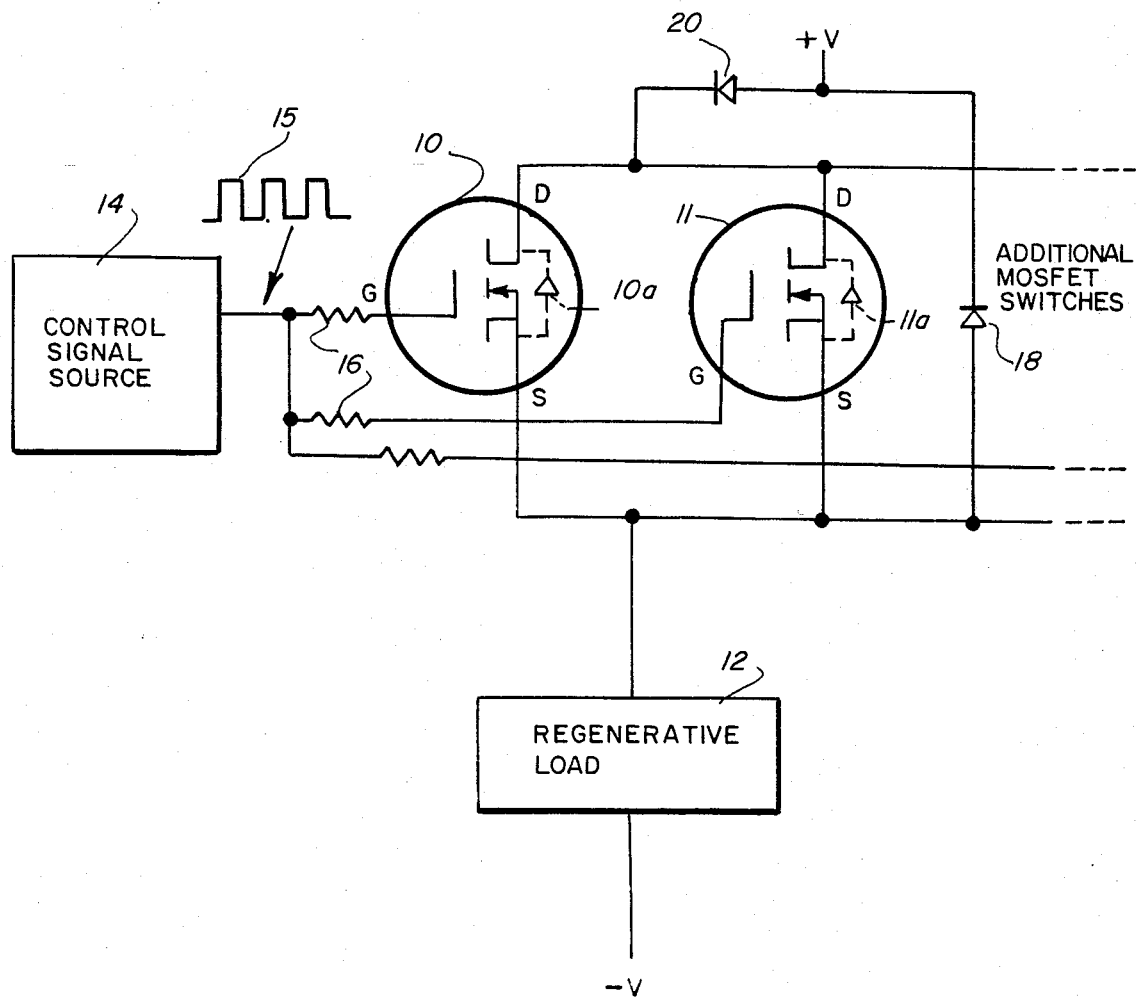

PARALLEL MOSFET POWER SWITCH CIRCUIT

TECHNICAL FIELD

This invention relates to a high power electrical switching circuit using parallel connected metal oxide semiconductor field effect transistors.

BACKGROUND OF THE INVENTION

Metal oxide semiconductor field effect transistors (typically referred to as MOSFETs) are capable of the high switching speeds needed for powering such loads as an electric motor from a DC supply. However, the current rating of available MOSFETs is not adequate to carry the current required for many sizes of motors. Accordingly, it is often desirable to operate two or more power MOSFETs in parallel in a switching circuit.

The forward resistance of the drain-source circuit of power MOSFETs is typically uniform from MOSFET to MOSFET. Accordingly, the MOSFETs may be connected in parallel in a switching circuit and the switched currents will divide substantially equally among the MOSFETs so that the individual MOSFET current rating is not exceeded.

A power MOSFET has an inherent reverse diode junction between the source and drain elements. When the MOSFET switch is used with a regenerative load, the reverse current which occurs as the switch is opened or turned off flows through the reverse diode junction. The resistance of the reverse junctions of MOSFETs may differ substantially. With a plurality of MOSFETs connected in parallel, the reverse current from a regenerative load divide in inverse relation to the reverse junction resistances. The current may exceed the reverse junction current rating, causing MOSFET failure.

SUMMARY OF THE INVENTION

It is an object of this invention to provide a parallel MOSFET power switching circuit in which the reverse current from a regenerative load is diverted from the reverse diode junctions to avoid the problem outlined above.

More particularly, it is a feature of the power switching circuit that a diode is connected in parallel with the source-drain circuits of the MOSFETs and poled to conduct the reverse current from the load. A second diode is connected in series with the source-drain circuits of each of the MOSFET switches and poled to block current flow through the reverse diode junctions of the MOSFETs.

Further features and advantages will be apparent from the following description and from the drawing which is a schematic diagram of a power switch circuit incorporating the invention.

The switching circuit disclosed may be used in controlling the current from a DC supply to a regenerative load, as, for example, a DC motor. The switching circuit may be turned on and off, or the switch closed and opened, by pulses from a control signal source. The pulses are modulated to control the power to the load and the load operation. For example, with a DC motor, the motor speed is controlled.

With particular reference to the drawing, a plurality of MOSFETs 10, 11 have their source-drain circuits connected in parallel from one terminal +V of a DC supply to the regenerative load 12. The load circuit is completed to the other terminal −V of the DC supply.

Each of the MOSFETs 10, 11 has an inherent or parasitic reverse diode 10a, 11a connected as indicated by dashed lines in parallel with the source-drain circuit.

A control signal source 14 has an output which is a series of pulses indicated by waveform 15. The switching control signal from source 15 is connected through isolating resistors 16 with the gate elements of the MOSFETs 10, 11. The switching control pulses may be modulated, as by width modulation, to control the power delivered to load 12.

The forward resistance of the source-drain circuits of the MOSFETs is substantially the same. Accordingly, the forward current from the DC supply to load 12 divides substantially equally among the MOSFETs. However, the resistance of the reverse diode junctions may differ substantially from MOSFET to MOSFET so that the reverse currents divide unequally and may exceed the reverse current rating of one or more of the MOSFETs.

In accordance with the invention, a first diode 18 is connected in parallel with the MOSFETs between the regenerative load 12 and the terminal +V of the DC supply. Diode 18 is selected with a current rating sufficient to carry the entire reverse current from load 12.

In order to prevent reverse current flow through the reverse diodes 10a, 11a of the MOSFETs, a second diode 20 is connected in series between the DC supply terminal +V and the drain elements of the MOSFETs and poled to block the reverse current. Thus, all of the reverse current is forced to flow through the parallel connected diode 18.

Additional MOSFET switches may be connected in parallel with MOSFETs 10, 11 as indicated by the dashed lines at the right of the figure.

A suitable power MOSFET is a type IRF 450 of International Rectifier, rated to operate at 450 volts and to carry a forward current of 13 amperes. The reverse diode also has a current rating of 13 amperes.

A power MOSFET has a very high speed switching action. Typically the turn on delay time is of the order of $35 \times 10^{-9}$ seconds with a current rise time of $50 \times 10^{-9}$ seconds. The turn off delay time is $150 \times 10^{-9}$ seconds with a current decay time of $70 \times 10^{-9}$ seconds. The frequency of the control signal 15 may be of the order of 10 KHz with pulse width modulation to control the power to the load.

I claim:

1. A power switching circuit for switching power from a DC supply to a regenerative load, comprising:

a plurality of power MOSFETs each having source, drain and gate elements with the source-drain circuits parallel connected between the DC supply and the regenerative load, each of said MOSFETs having an inherent reverse diode junction between the source and drain elements;

a control signal source having a switching control signal output connected with the gate element of each MOSFET, switching the MOSFET source-drain circuits on and off at a selected rate;

a first diode connected in parallel with the source-drain circuits of said power MOSFETs and poled to conduct reverse current from the load; and a second diode connected in series with the source-drain circuits of said power MOSFETs and poled to block current flow through the reverse diode junctions of the MOSFETs, the series combination of the second diode and the source-drain circuits of the power MOSFETs being shunted by said first diode.

2. The power switching circuit of claim 1 including isolation resistors connected between the control signal source and the gate element of each of said MOSFETs.

3. The power switching circuit of claim 1 in which the DC supply has positive and negative terminals and the load has two terminals, said second diode being connected between one of the terminals of the DC supply and the source-drain circuits of said MOSFETs, one terminal of said load being connected with the source-drain circuits of said MOSFETs, the other terminal of said load being connected with the other terminal of said DC supply and said first diode being connected between said one terminal of the load and said one terminal of the DC supply.

* * * * *